(12) United States Patent
Magri' et al.

(10) Patent No.: US 8,405,144 B2
(45) Date of Patent: Mar. 26, 2013

(54) SEMICONDUCTOR DEVICE WITH VERTICAL CURRENT FLOW AND LOW SUBSTRATE RESISTANCE AND MANUFACTURING PROCESS THEREOF

(75) Inventors: Angelo Magri', Belpasso (IT); Antonio Damaso Maria Marino, Pedara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/357,547

(22) Filed: Jan. 24, 2012

(65) Prior Publication Data
US 2012/0119381 A1 May 17, 2012

Related U.S. Application Data

(63) Continuation of application No. 11/800,979, filed on May 7, 2007, now Pat. No. 8,101,991.

(30) Foreign Application Priority Data

May 5, 2006 (IT) .............................. TO2006A0329

(51) Int. Cl.
*H01L 29/66* (2006.01)
(52) U.S. Cl. .................... 257/328; 257/774; 257/E23.01
(58) Field of Classification Search .................. 257/328, 257/774, E23.01
See application file for complete search history.

(56) References Cited

U.S. PATENT DOCUMENTS

| | | |
|---|---|---|
| 6,225,674 B1 | 5/2001 | Lim et al. |
| 6,768,201 B1 | 7/2004 | Imade et al. |
| 2001/0002733 A1 | 6/2001 | Bessho et al. |
| 2001/0005057 A1 | 6/2001 | Pasch et al. |

*Primary Examiner* — Jenny L Wagner
(74) *Attorney, Agent, or Firm* — Graybeal Jackson LLP

(57) ABSTRACT

A semiconductor device with vertical current flow includes a body having a substrate made of semiconductor material. At least one electrical contact on a first face of the body. A metallization structure is formed on a second face of the body, opposite to the first face. The metallization structure is provided with metal vias, which project from the second face within the substrate so as to form a high-conductivity path in parallel with portions of said substrate.

24 Claims, 8 Drawing Sheets

US 8,405,144 B2

SEMICONDUCTOR DEVICE WITH VERTICAL CURRENT FLOW AND LOW SUBSTRATE RESISTANCE AND MANUFACTURING PROCESS THEREOF

PRIORITY CLAIM

The present application is a Continuation of copending U.S. patent application Ser. No. 11/800,979, filed May 7, 2007; which application claims the benefit of Italian Patent Application No. TO2006A 000329, filed May 5, 2006; all of the foregoing applications are incorporated herein by reference in their entireties.

TECHNICAL FIELD

Embodiments relate to a semiconductor device with vertical current flow and low substrate resistance and to a manufacturing process thereof.

BACKGROUND

It is known that, in semiconductor devices with vertical current flow (for example, bipolar transistors and field-effect transistors, IGBTs, Schottky diodes, and junction diodes), the maximum current in the conduction state is limited by the so-called active-state resistance (or ON resistance) present between the conduction terminals.

The ON resistance, which obviously is ideally minimized, is determined by the sum of various contributions, associated with the different structures that form the device. FIG. 1 schematically shows a succession of layers normally present in a vertical current flow device 1 encapsulated in a package 2. The encapsulated device 1 comprises a semiconductor die 3, coupled to a first electrode 4 and a second electrode 5 of the package 2 (herein shown only in part). The die 3 includes a substrate 6, which functions as support and as connection layer for active structures 7, not illustrated in detail (for example, source and channel regions of a MOS transistor). On a front side 3a of the die 3, the active structures 7 are provided with metal electrodes 8, coupled to the first electrode 4 of the package by means of wires or jumpers 9. A rear side 3b of the die 3, defined by a face of the substrate 6, is coated with a rear-metallization layer 10 and fixed to the second electrode 5 of the package by means of a conductive bonding layer 11.

The ON resistance is determined in part by the package (electrodes 4, 5, wires and/or jumpers 9, contacts), in part by the active structures 7 and in part by parasitic resistances of the substrate 6, of the rear-metallization layer 10, of the bonding layer 11 and of the corresponding interfaces. The development of innovative constructional solutions has enabled in recent times a substantial reduction in the resistance of the active structures 7. In the same way, the pressing need of reducing power consumption and of miniaturizing the components to be able to incorporate them in increasingly sophisticated portable apparatuses has accelerated the development also of the packages both from the standpoint of the overall dimensions and from the electrical standpoint, reducing further the ON resistance.

Especially in some relatively low-voltage (20-30 volts) applications, increasing importance is associated with the contributions of the parasitic substrate resistance, of the contact interface with the rear-metallization layer 10 and, to a lesser extent, of the resistance of the rear-metallization layer 10 itself and of the bonding layer 11. On the one hand, then, it would be desirable to decrease the contribution of the structures listed above to the ON resistance. On the other hand, the parasitic substrate resistance, which has a determining weight, depends basically upon the thickness of the substrate 5, which cannot be reduced beyond a certain limit (approximately 100 μm). Otherwise, in fact, the substrate 5 would lose its mechanical function of support both during machining of the semiconductor wafers and after cutting and separation of the devices produced, and the risk of collapse of the structures would be too high.

SUMMARY

Embodiments of the present disclosure reduce parasitic substrate resistance.

According to various embodiments, a semiconductor device with vertical current flow and a process for fabrication of such a device are provided.

BRIEF DESCRIPTION OF THE DRAWINGS

For a better understanding of the disclosure, some embodiments thereof are now described, purely by way of non-limiting example and with reference to the attached drawings, wherein:

FIG. 16b shows a variant of the embodiment of FIG. 16a;

DETAILED DESCRIPTION

The following discussion is presented to enable a person skilled in the art to make and use the embodiments described in the present disclosure. Various modifications to the embodiments will be readily apparent to those skilled in the art, and the generic principles herein may be applied to other embodiments and applications without departing from the spirit and scope of the present disclosure. Thus, the embodiments described in the present invention are not intended to be limited to the embodiments shown, but are to be accorded the widest scope consistent with the principles and features disclosed herein.

Figure 1:
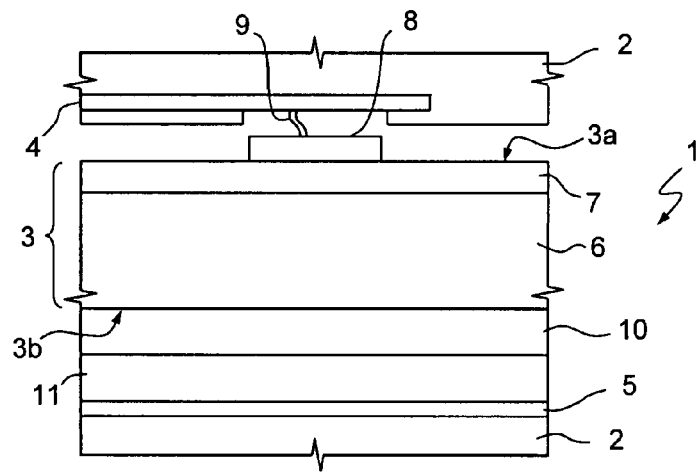
FIG. 1 shows a cross section through a semiconductor device with vertical current flow of a known type, encapsulated in a package.
Figure 2:
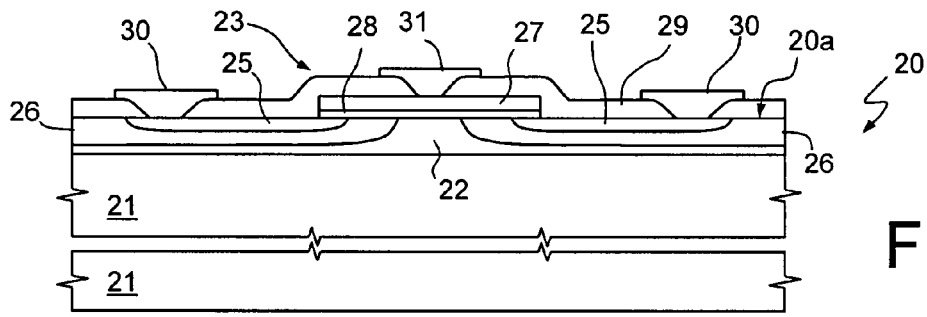
FIGS. 2-5 are cross-sectional views through a semiconductor wafer in subsequent steps of a process for the fabrication of a semiconductor device with vertical current flow in accordance with a first embodiment.

FIG. 2 illustrates a semiconductor wafer 20, comprising a substrate 21 and an epitaxial layer 22, having the same type of conductivity, for example N, and different doping levels. By means of conventional semiconductor manufacturing steps (such as, for example, deposition, growth, and shaping of semiconductor and dielectric layers, masking, steps of implantation and activation of dopant-ion species, deposition and definition of conductive layers such as metal layers, and so forth), a front face 20a of the semiconductor wafer 20, where also the epitaxial layer 22 is found, is processed to obtain a front portion of a MOS transistor 23 with vertical current flow, here illustrated only schematically. In particular, the front portion of the MOS transistor 23 comprises: an annular source region 25; a body region 26, which is also annular, formed in the epitaxial layer 22 and housing the source region 25; a gate region 27, separated from the epitaxial layer 22 by a gate-oxide region 28 and, moreover, partially overlapping the source region 25 and on the body region 26; a protective layer 29, coating the epitaxial layer 22 and the gate region 28; source contacts 30 and gate contacts 31, passing through the protective layer 29 and projecting on the front face 20a of the semiconductor wafer 20.

Figure 3:
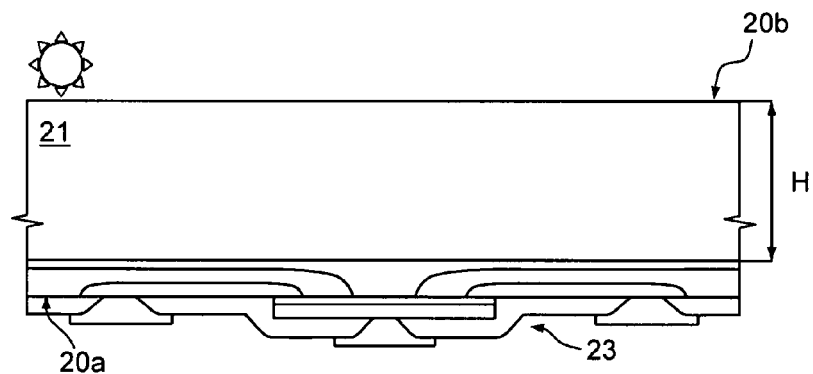

Next (FIG. 3), the semiconductor wafer 20 is turned upside down and is thinned out mechanically by milling until the substrate 21 reaches a pre-determined thickness H. A free surface of the substrate 21, opposite to the front face 20a defines a rear face 20b of the semiconductor wafer 20.

Figure 4:
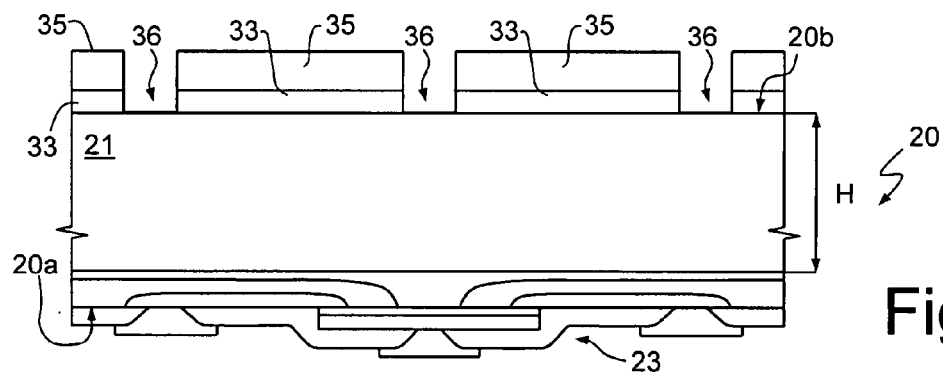

A hard mask 33 having openings 36 (FIG. 4) is then formed on the rear face 20b of the semiconductor wafer 20 by depositing and shaping a hard-mask layer (not illustrated completely), for example made of silicon oxide or silicon nitride and having a thickness of between 500 nm and 2000 nm. The deposition is preferably a PECVD (plasma-enhanced chemical vapor deposition). Shaping of the hard-mask layer is performed by a photolithographic process, using a resist mask 35.

Figure 5:
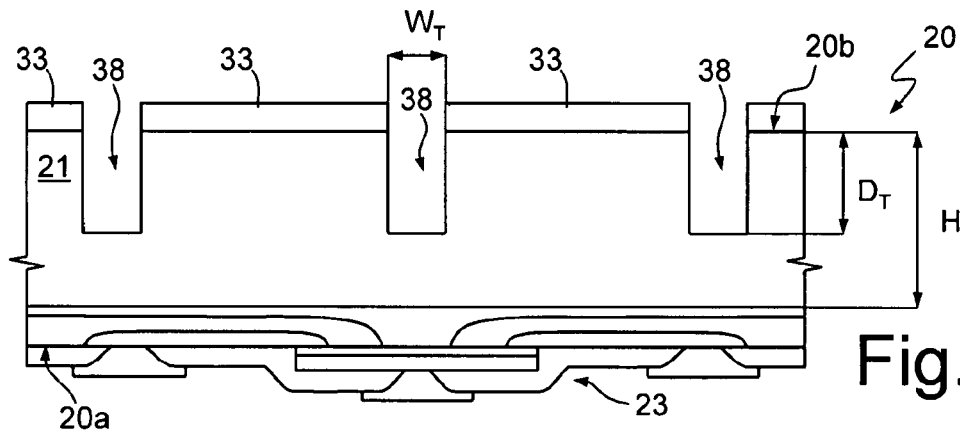
Figure 6:
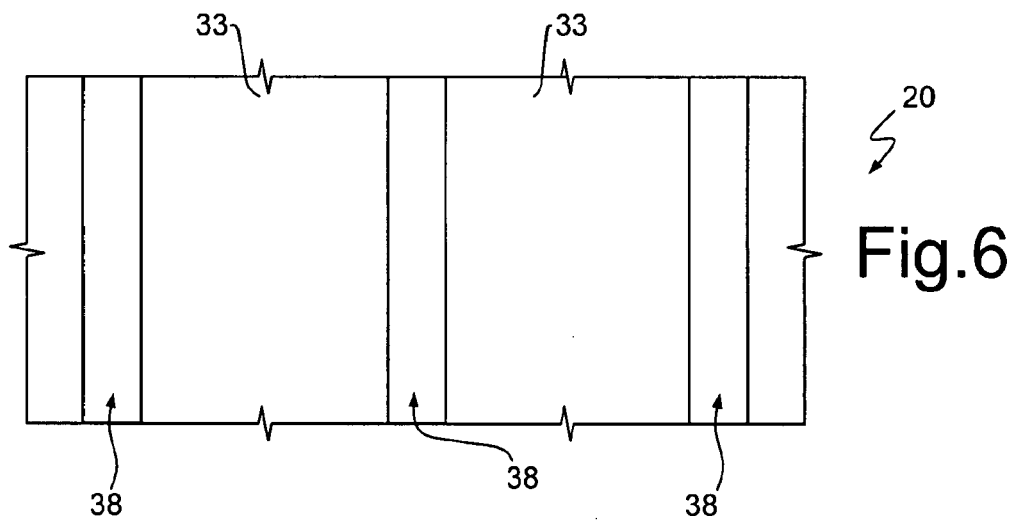
FIG. 6 is a top plan view of the wafer of FIG. 5.

The substrate 21 is then anisotropically etched to open trenches 38 with rectangular cross section through the openings 36 of the hard mask 33, as shown in FIG. 5. The trenches 38 have a depth $D_T$ smaller than the thickness H of the substrate 21 and hence extend through the substrate 21 itself, without traversing it completely. The depth $D_T$ of the trenches 48 may be between 25% and 75% of the thickness H of the substrate 21. Furthermore, the development of the trenches 38 is defined by the shape of the openings 36 of the hard mask 33 (FIG. 6). In the embodiment described herein, in particular, the trenches 38 are rectilinear and arranged parallel to one another. Furthermore, the trenches 38 have equal width W and are uniformly spaced apart from one another. The overall area occupied by the trenches 38 is approximately 10% of the total area of the rear face 20b of the semiconductor wafer 20 in one embodiment.

Figure 7:
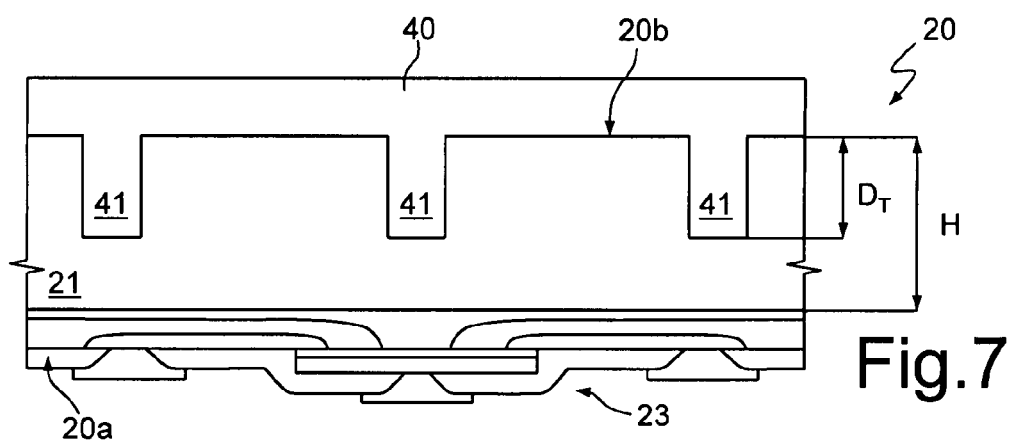
FIG. 7 shows the same view as that of FIG. 5, in a subsequent step of fabrication.
Figure 8:
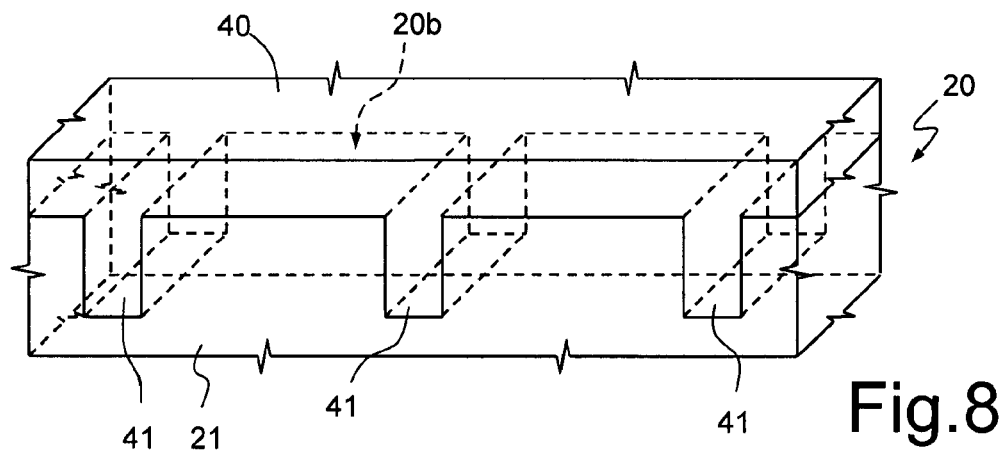
FIG. 8 is a partial perspective view of the wafer of FIG. 7.

After removing the hard mask 33 (FIG. 7), a conductive structure such as a rear-metallization structure 40 is formed on the rear face 20b of the semiconductor wafer 20 by deposition in sequence of one or more metal layers, herein not shown in detail (for example, TiNiAu, CrNiAu, or TiNiAg). The rear-metallization structure 40 fills the trenches 38 to form high-conductivity metal vias 41 that project from the rear face 20b towards the inside of the substrate 21, without traversing it completely. As shown in FIG. 8, the metal vias 41 have the shape of rectilinear ribbings with rectangular cross section, are parallel to one another, and are accommodated in the substrate 21.

The semiconductor wafer 20 has at this point electrical contacts both on the front face 20a (source contacts 30 and one gate contact 31) and on the rear face 20b (rear-metallization structure 40).

Figure 9:
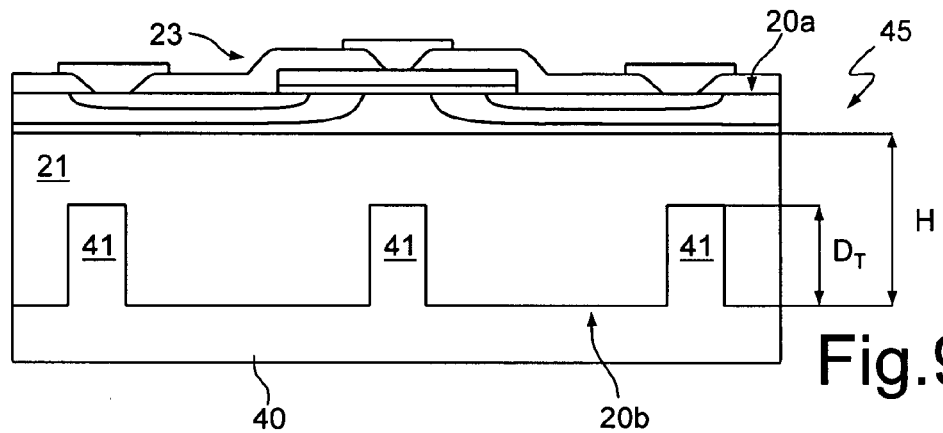
FIG. 9 shows a cross section through a die, which is obtained by cutting the wafer of FIG. 7, after a further step of fabrication, and incorporates the semiconductor device in accordance with the first embodiment.

Next (FIG. 9), the semiconductor wafer 20 is split into dice 45, each of which comprises at least one MOS transistor 23.

Figure 10:
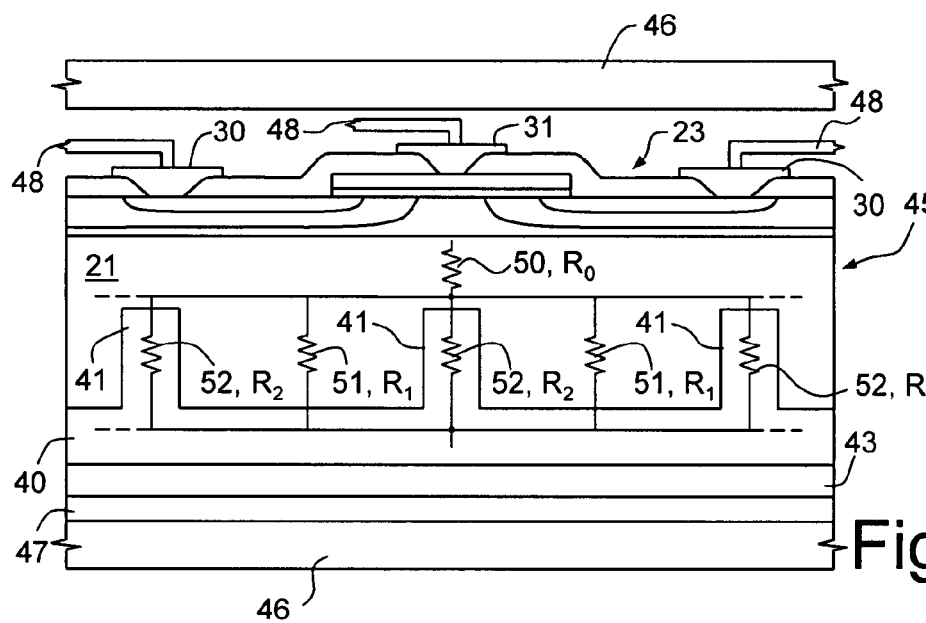
FIG. 10 shows the die of FIG. 9 encapsulated in a package.

Finally, each die 45 is encapsulated in a package 46 to obtain the structure shown in FIG. 10. More precisely, the metallization structure 40 of the die 45 is fixed to a drain electrode 47 of the package 46 by a conductive bonding layer 43, whereas the source contacts 30 and the gate contact 31 are, respectively, coupled to a source electrode and a gate electrode (not shown) over wires 48 (or other type of electrical connections).

In the MOS transistor 23 described, the resistance components due the substrate 21 and to the interface between the substrate 21 itself and the metallization structure 40 are advantageously reduced. In practice, in fact, the metal vias 41 define a high-conductivity path in parallel to portions of the substrate 21, thus markedly reducing the resistance thereof. For reasons of clarity, reference may be made to the equivalent electrical circuit shown in FIG. 10, where three contributions are highlighted:

a first contribution, represented by a first resistor 50, is due to a continuous portion of the substrate 21, comprised between the epitaxial layer 23 and the top of the metal vias 41;

a second contribution, represented by second resistors 51, is due to portions of the substrate 21 comprised between metal vias 41; and a third contribution, represented by third resistors 52, is due to the metal vias 41.

Associated with the first resistor 50 is a resistance $R_0$ given by:

$$R_0 = \rho_{SUB} \frac{H_S - D_T}{A_T} \tag{1}$$

where $\rho_{SUB}$ is the resistivity of the substrate 21, and $A_T$ is the total area of the rear face 20b of the die 45.

The resistance values as a whole associated with the second resistors 51 and the third resistors 52, designated respectively by $R_1$ and $R_2$, are instead given by:

$$R_1 = \rho_{SUB} \frac{D_T}{A_T - A_V} \tag{2}$$

$$R_2 = \rho_V \frac{D_T}{A_V} \tag{3}$$

where $\rho_V$ is the resistivity of the metal vias 41, and $A_V$ is the portion of the total area $A_T$ occupied thereby (in the case described, $A_V \cong 0.1\ A_T$). The resistance value $R_2$ associated with the third resistors 52 (metal vias 41) is decidedly lower than the resistance value $R_1$ associated with the second resistors 51 (portions of the substrate 21 arranged in parallel to the metal vias 41). The resistivity $\rho_V$ of the metal vias 41 is in fact normally at least two orders of magnitude lower than the resistivity $\rho_{SUB}$ g of the substrate 21.

The total resistance $R_T$ is then given by $$R_T = R_0 + (R_1/R_2) \cong R_0 + R_2 \quad (4)$$

which is smaller than the resistance that the (continuous) substrate 21 would have in the absence of the metal vias 21.

Figure 11:
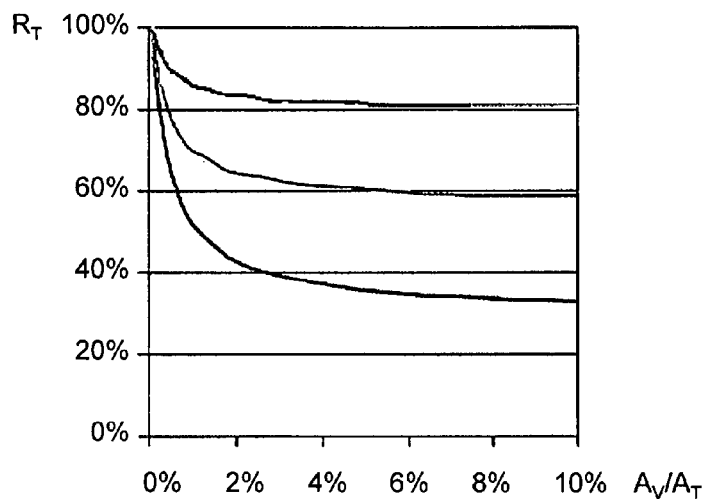
FIG. 11 is a graph showing quantities corresponding to the device of FIGS. 9 and 10.

As illustrated in the graph of FIG. 11, which shows the percentage variations of the total resistance $R_T$ as a function of the fraction of area $A_V/A_T$ occupied by the metal vias 41 with respect to the total area $A_T$, a significant improvement is obtained already with $A_V \cong 0.1 A_T$, as already indicated above. In practice, the metal vias 41 occupy a small part of the total area $A_T$ of the die 45, and hence the structural function of support of the substrate 21 is preserved.

Also the resistance associated with the interface between the substrate 21 and the rear-metallization structure 40 is reduced because the presence of the metal vias 41 increases considerably the surface of contact between them. A further advantage deriving from the increase in the surface of contact between semiconductor structures and metallic structures is the better capacity for dissipating the heat produced during operation of the MOS transistor 23.

Another advantage lies in that the metal vias 41 do not require being aligned to the active structures provided in the epitaxial layer 22. Production is thus simplified.

Figure 12:
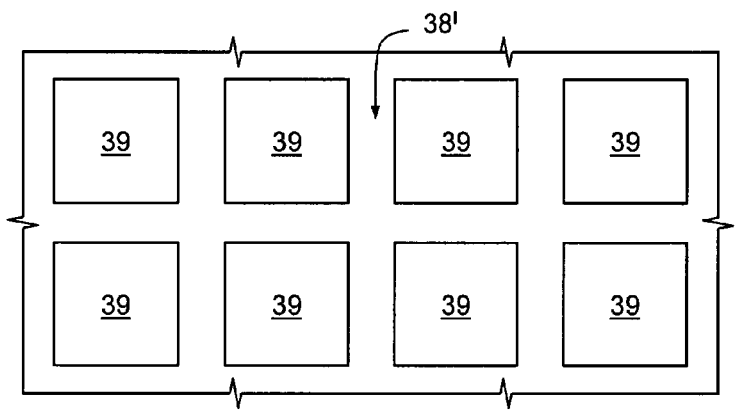
FIG. 12 is a top plan view of a semiconductor wafer in an intermediate step of a process in accordance with a second embodiment.
Figure 13:
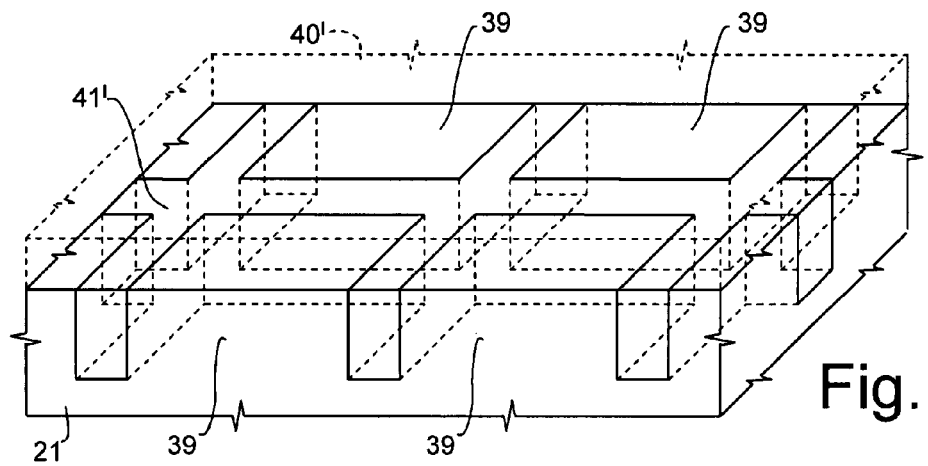
FIG. 13 is a partial perspective view of the wafer of FIG. 12 in a subsequent step of fabrication.

FIGS. 12 and 13 show a second embodiment. In this case (FIG. 12), a trench 38$^I$ in the form of a grid, which delimits columns 39, is opened in the substrate 21. As shown in FIG. 13, one or more metal layers (not illustrated separately) are deposited in succession to form a rear-metallization structure 40$^I$, and the trench 38$^I$ is then filled (the portion of the metallization structure 40$^I$ exceeding the trenches 38$^I$ is illustrated by a dashed line for reasons of clarity). The rear-metallization structure 40$^I$ hence comprises metal vias 41$^I$ that project towards the inside of the substrate 21 and define a grid accommodated in the substrate 21 itself.

Figure 14:
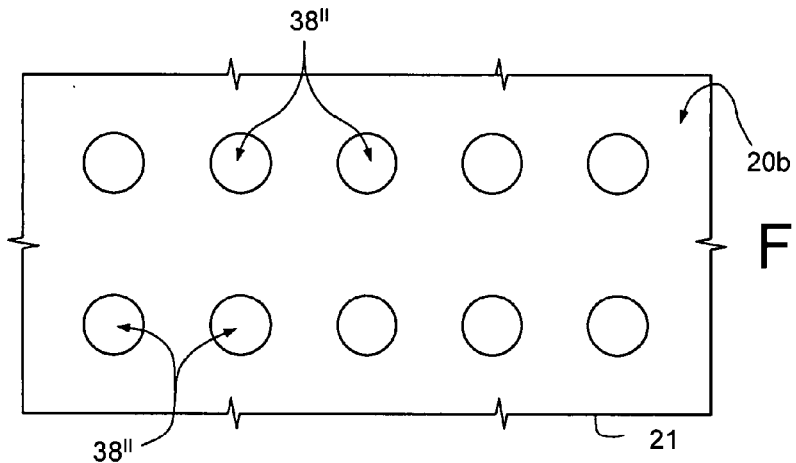
FIG. 14 is a top plan view of a semiconductor wafer in an intermediate step of a process in accordance with a third embodiment.
Figure 15:
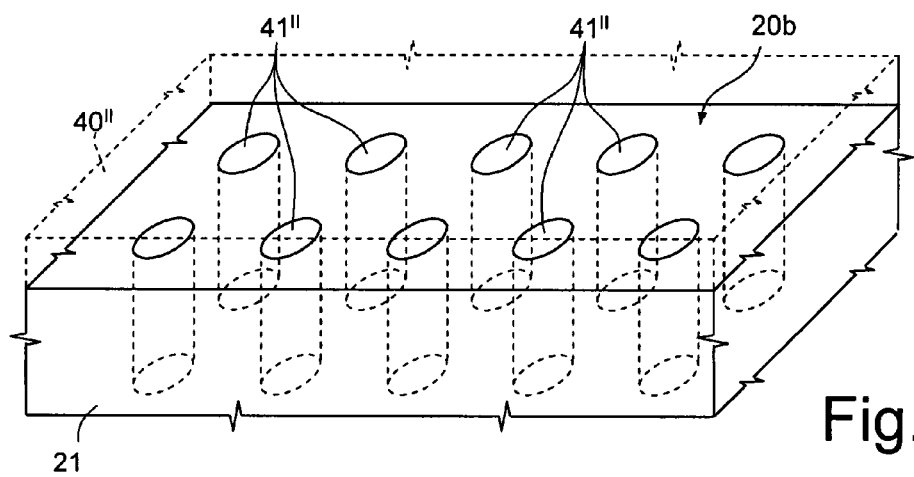
FIG. 15 is a partial perspective view of the wafer of FIG. 14 in a subsequent step of fabrication.

In accordance with a third embodiment (illustrated in FIGS. 14 and 15), provided in the substrate 21 is a plurality of cylindrical (or prismatic) trenches 38$^{II}$, uniformly distributed on the rear face 20b of the semiconductor wafer 20. Next (FIG. 15), a rear-metallization structure 40$^{II}$ is formed by depositing one or more metal layers (not shown separately) in sequence, thereby filling the trenches 38$^{II}$ (the portion of the metallization structure 40$^I$ exceeding the trenches 38$^{II}$, for reasons of clarity, is illustrated with a dashed line). The rear-metallization structure 40$^{II}$ hence comprises metal vias 41$^{II}$ shaped like pins accommodated in the substrate 21.

Figure 16A:
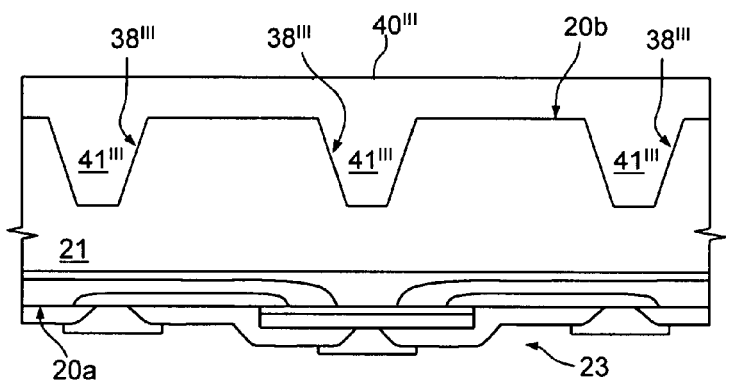
FIG. 16a is a cross section through a semiconductor wafer in an intermediate step of a processed in accordance with a fourth embodiment.
Figure 16B:
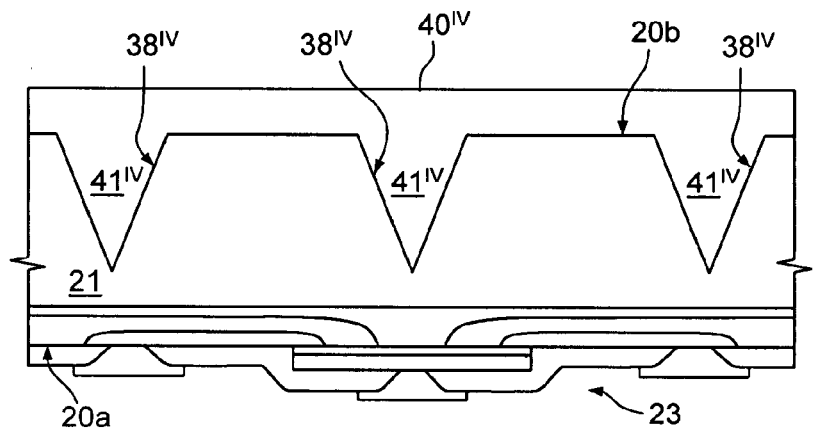

According to a fourth embodiment (FIG. 16a), the substrate 21 is wet etched after the step of thinning, and trenches 38$^{III}$ having a trapezial cross section are opened. A rear-metallization structure 40$^{III}$ is then provided by depositing one or more metal layers (not shown separately) in sequence, thereby filling the trenches 38$^{III}$. The rear-metallization structure 40$^{III}$ hence comprises metal vias 41$^{III}$ having the form of ribbings with a trapezial cross section. According to a variant (FIG. 16b), the trenches and the ribbings, respectively designated by 38$^{IV}$ and 41$^{IV}$, have a triangular cross section.

Figure 17:
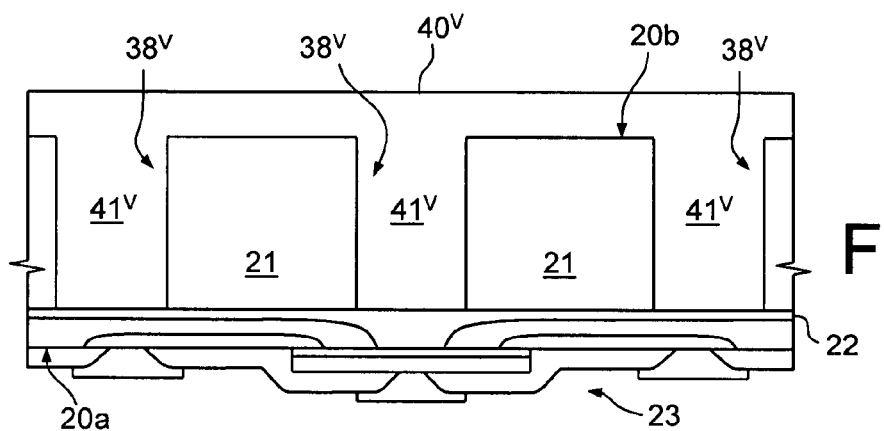
FIG. 17 is a cross section through a semiconductor wafer in an intermediate step of a process in accordance with a fifth embodiment.
Figure 18:
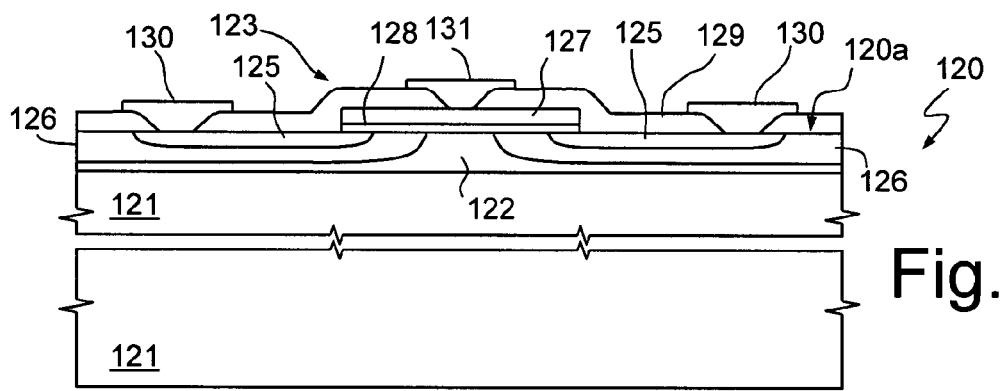
FIGS. 18-21 are cross-sectional views through a semiconductor wafer in subsequent steps of a process for the fabrication of a semiconductor device with vertical current flow in accordance with a sixth embodiment.

A fifth embodiment is shown in FIG. 17. In this case, after the step of thinning, trenches 38$^V$ are opened in the substrate 21, which traverse it completely. A rear-metallization structure 40$^V$ is then provided by depositing one or more metal layers (not shown separately) in sequence, thereby filling the trenches 38$^V$. Metal vias 41$^V$ are thus provided, which traverse completely the substrate 21 as far as the epitaxial layer 22.

A sixth embodiment will be described hereinafter, with reference to FIGS. 18-23.

In this case, a semiconductor wafer 120 initially comprises a substrate 121 and an epitaxial layer 122. By conventional steps of fabrication of semiconductors, a front face 120a of the semiconductor wafer 120, where also the epitaxial layer 122 is found, is processed to obtain a front portion of a MOS transistor 123 with vertical current flow, herein illustrated only schematically. In particular, the front portion of the MOS transistor 123 comprises: an annular source region 125; a body region 126, which is also annular, is formed in the epitaxial layer 122, and accommodates the source region 125; a gate region 127, separated from the epitaxial layer 122 by a gate-oxide region 128 and, moreover, partially overlapping the source region 125 and the body region 126; a protective layer 129, coating the epitaxial layer 122 and the gate region 128; source contacts 130 and gate contacts 131, passing through the protective layer 129 and projecting on the front face 120a of the semiconductor wafer 120.

Figure 19:
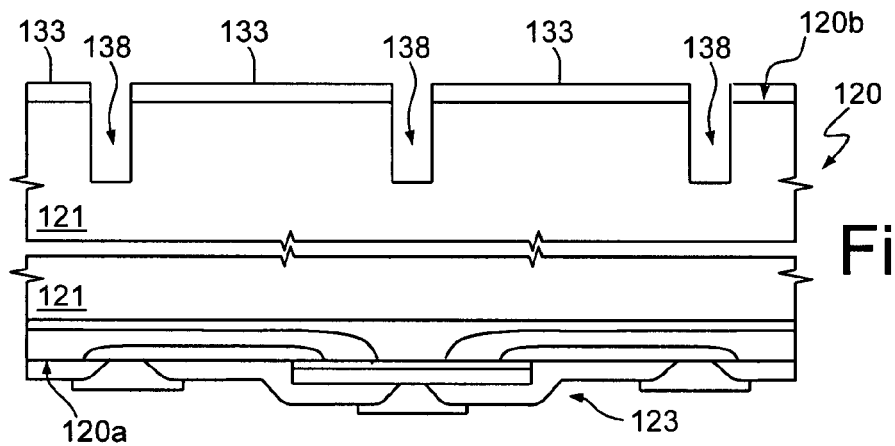
Figure 20:
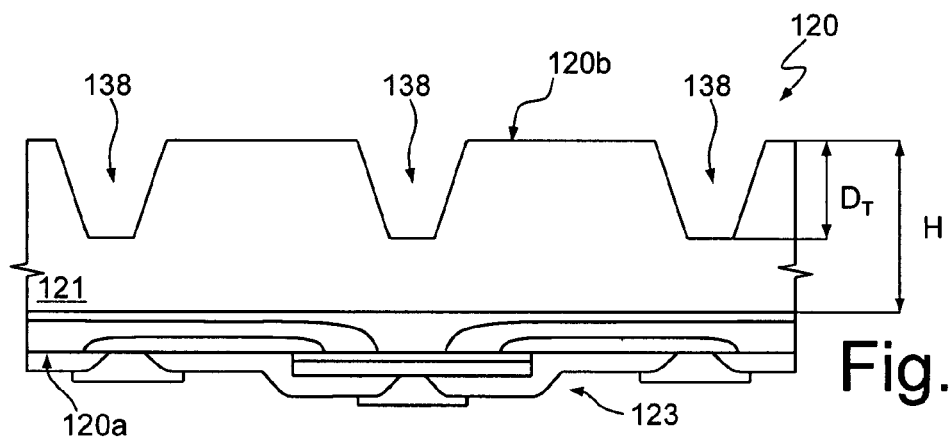
Figure 21:
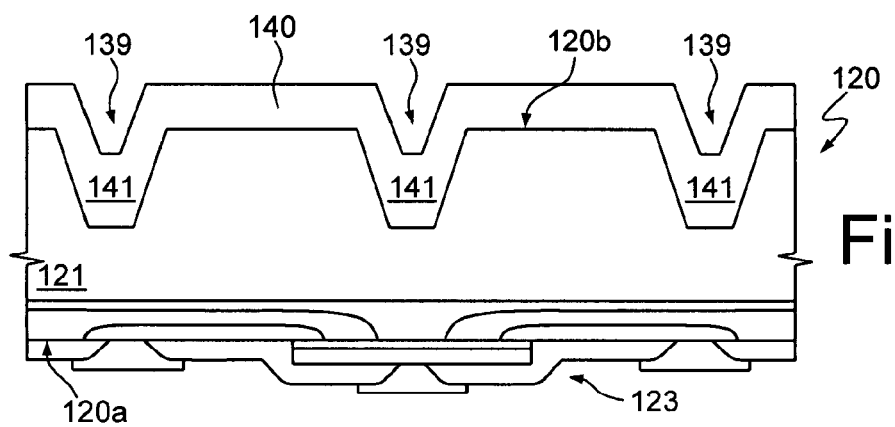
Figure 22:
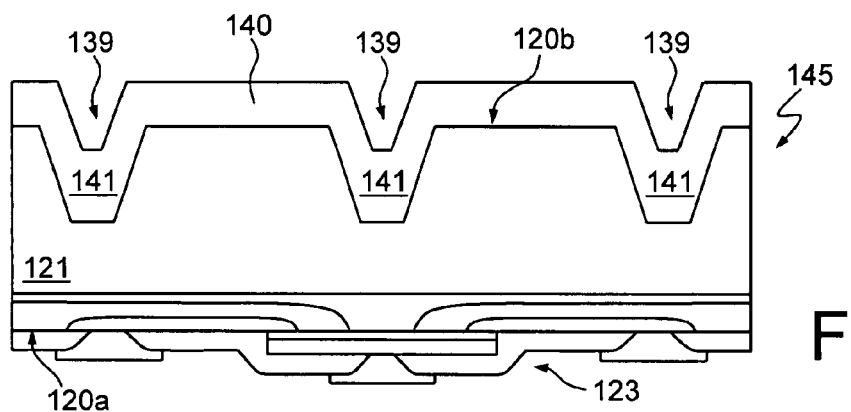
FIG. 22 shows a cross section through a die obtained by cutting the wafer of FIG. 19, after a further step of fabrication, and incorporating the semiconductor device in accordance with the sixth embodiment.

As shown in FIG. 19, the semiconductor wafer 12 is turned upside down, and a hard mask 133 is provided on a rear face 120b thereof, defined by a free surface of the substrate 121. Then, the substrate 121 is anisotropically etched using the hard mask 133, to open up trenches 138, up to a pre-determined depth. Furthermore, the trenches 138 are parallel to one another and are uniformly spaced apart.

After removing the hard mask 133 (FIG. 20), the substrate 121 is again chemically etched and thinned out until a pre-determined thickness H is reached. Preferably, a wet etch is carried out. In this step, the trenches 138 tend to widen, especially towards their mouth on the rear face 120b of the semiconductor wafer 120, and their cross section becomes trapezial in shape. The final depth D of the trenches 138 is equal to a pre-determined fraction of the thickness H of the substrate 121, preferably between 25% and 75%. Furthermore, the trenches 138 occupy as a whole a fraction of the total area of the rear face 120b of approximately 10%.

Next (FIG. 21), a rear-metallization structure 140 is formed on the rear face 120b by depositing one or more metal layers in sequence (not shown individually). In the embodiment described herein, moreover, the total thickness of the rear-metallization structure 140 is such that the trenches 138 in this step are filled only partially and depressions 139 remain on a surface 140a opposite to the substrate 121. In any case, the rear-metallization structure 140, insinuating in the trenches 138, forms high-conductivity metal vias 141, which project from the rear face 120b towards the inside of the substrate 121, without traversing it completely. The metal vias 141 are shaped like parallel rectilinear ribbings, are accommodated in the substrate 121 and have a substantially trapezial cross section. The semiconductor wafer 120 presents at this point electrical contacts both on the front face 120a (source contacts 130 and one gate contact 130) and on the rear face 120b (rear-metallization structure 140).

Then (FIG. 22), the semiconductor wafer 120 is cut into dice 145, each of which comprises at least one MOS transistor 123.

Figure 23:
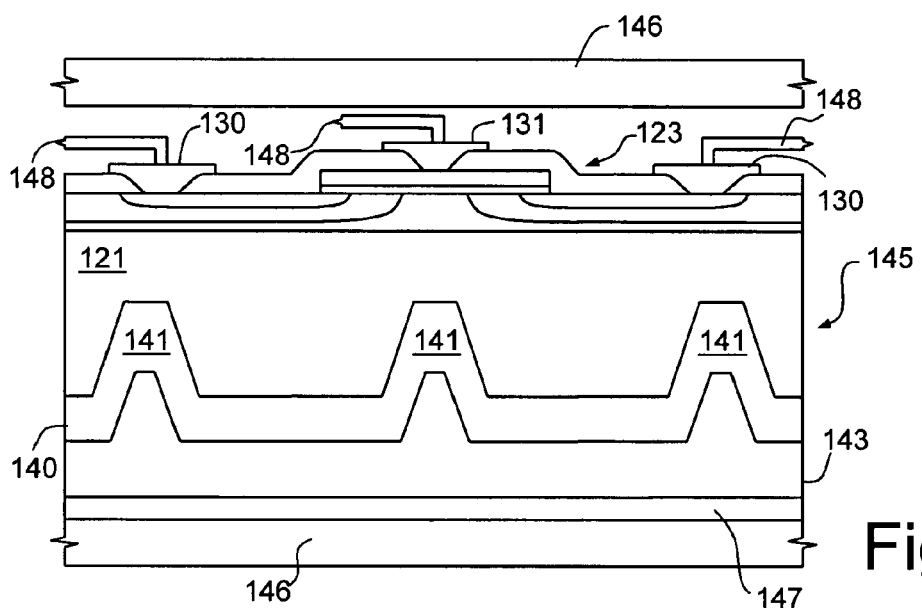
FIG. 23 shows the die of FIG. 20 encapsulated in a package.

Finally, each die 145 is encapsulated in a package 146 to obtain the structure shown in FIG. 23. The metallization structure 140 of the die 145 is fixed to a drain electrode 147 of the package 146 by a conductive bonding layer 143, which fills the depressions 139 completely. The source contacts 130 and the gate contact 131 are, respectively, coupled to a source electrode and to a gate electrode (not shown) by wires 148 (or other types of electrical connections). Advantageously, the surface of contact between the rear-metallization structure 140 and the bonding layer 143 is widened because it is not planed, and hence the corresponding interface resistance is low.

Finally, it is evident that modifications and variations can be made to the device and process described herein, without thereby departing from the scope of the present disclosure, as defined in the annexed claims. In particular, embodiments can be exploited for making any type of semiconductor device with vertical current flow, such as, in particular, JFETs, bipolar transistors, IGBTs, Schottky diodes, and junction diodes.

Semiconductor devices formed according to embodiments can be included in a variety of different types of integrated circuits. These integrated circuits may, in turn, be contained in a variety of different types of electronic systems, such as control systems, embedded systems, computer systems, and so on.

From the foregoing it will be appreciated that, although specific embodiments have been described herein for purposes of illustration, various modifications may be made without deviating from the spirit and scope of the described embodiments.

The invention claimed is:

1. A semiconductor device, comprising:
a body including a substrate of semiconductor material;
at least one contact formed over a first face of the body;
a conductive structure formed over a second face of the body, the second face being opposite to the first face;
wherein the conductive structure has a first portion formed over the second face of the body and has a second portion including conductive vias projecting from the first portion within the substrate to form a high-conductivity path in parallel to portions of the substrate surrounding the conductive vias; and
wherein the high-conductivity path and portions of the substrate collectively form a current path for current flow through the high-conductivity path and portions of the substrate between each contact over the first face of the body and the first portion of the conductive structure over the second face of the body.

2. The semiconductor device of claim 1, wherein the conductive structure and conductive vias are formed from a metallic material.

3. The semiconductor device of claim 1, wherein the conductive vias comprise a plurality of parallel rectilinear ribbings.

4. The semiconductor device of claim 1, wherein the conductive vias define a grid formed in the substrate.

5. The semiconductor device of claim 1, wherein the conductive vias are shaped like cylindrical pins.

6. The semiconductor device of claim 1, wherein the first portion of the conductive structure has a surface opposite to the second surface of the substrate and has depressions in areas of the surface corresponding to the conductive vias in the second portion of the conductive structure.

7. The semiconductor device according to claim 6, wherein the depressions are filled with a conductive bonding material.

8. The semiconductor device of claim 1, wherein the conductive vias occupy an area equal that is less than or equal to approximately 10% of a total area of the second face of the substrate.

9. The semiconductor device of claim 1, wherein the substrate has a thickness and wherein the conductive vias have a depth that is less than the thickness of the substrate, and wherein the depth of the conductive vias is approximately 25% and 75% of the thickness of the substrate.

10. The semiconductor device of claim 1, wherein the conductive vias are uniformly distributed in the substrate.

11. A process for manufacturing a semiconductor device, comprising:
forming an electrical contact over a first surface of a body including a substrate of semiconductor material; and
forming a metallization structure over a second surface of the body, the second surface being opposite the first surface and the metallization structure including a first structure formed over the second surface and including a second structure including metal projections extending within the substrate from the second surface towards the first surface; and
wherein the metal projections and the portions of the substrate surrounding the metal projections together form a current path for current to flow between the electrical contact and the first structure through both the metal projections and portions of the substrate surrounding the metal projections.

12. The process of claim 11, wherein forming the second structure of the metallization structure comprises opening at least one trench in the substrate and depositing at least one metallic material within each trench.

13. The process of claim 12, wherein depositing at least one metallic material comprises filling each trench.

14. The process of claim 12, wherein depositing at least one metallic material comprises filling partially each trench to thereby leave depressions on a surface of the metallization structure opposite to the substrate in areas corresponding to the metal projections.

15. The process of claim 14, further comprising filling the depressions with a conductive bonding material.

16. An electronic device, comprising:
a body portion including a substrate of semiconductor material, the body portion having a first surface and a second surface opposite the first surface and at least one active region of an electronic component formed in the body portion;
a contact region formed over the first surface of the body portion to contact at least one of the active regions;
a conductive structure including a first part formed over the second surface of the body portion and a second part extending within the substrate towards the first surface of the substrate; and
a current path formed by the second part of the conductive structure and the portions of the substrate around the second part of the conductive structure, the current path operable to provide a path for current to flow between the contact region and first part of the conductive through both the second part of the conductive structure and the portions of the substrate around the second part of the conductive structure.

17. The semiconductor device of claim 16, wherein the conductive structure further comprises an electrode layer formed on the first part of the conductive structure.

18. The semiconductor device of claim 16, wherein the second part of the conductive structure comprises a plurality of conductive projections.

19. The semiconductor device of claim 18, wherein the conductive projections are spaced apart and cylindrically shaped.

20. The semiconductor device of claim 18, wherein the conductive projections are uniformly distributed along the second surface of the body portion.

21. The semiconductor device of claim 18, wherein the conductive projections have rectangular, trapezial or triangular cross sections.

22. The semiconductor device of claim 18, wherein the conductive projections comprise metal projections.

23. An integrated circuit, comprising:
- a body portion including a semiconductor substrate and having a first surface and a second surface opposite the first surface;
- a plurality of electronic components including active regions formed in the semiconductor substrate;
- a plurality of contacts formed on the first surface of the body portion, each contact being formed to electrically connect to at least one of the active regions of the electronic components;
- a metallization structure formed on the second surface of the body portion and including metal vias extending within the body portion from the second surface towards the first surface, the metal vias and the portions of the semiconductor substrate surrounding the metal vias collectively forming a high-conductivity current path for current flow through both the metal vias and portions of the substrate surrounding the metal vias between each contact and the portion of the conductive structure formed on the second surface of the body portion; and
- a package encapsulating the body portion, the package including electrodes that are electrically coupled to the contacts.

24. The integrated circuit of claim 23, wherein the electronic components comprise at least one of a JFET, a bipolar transistor, an IGBT, a Schottky diode, and a junction diode.

* * * * *